Feb. 24, 1970 J. A. ZAGUSTA ET AL 3,497,410

METHOD OF DIE-STAMPING A PRINTED METAL CIRCUIT

Filed Feb. 5, 1965

INVENTORS
JOHN A. ZAGUSTA
BY, PAUL L. ANDERSON
Robert L. Churchill
ATTORNEY

United States Patent Office 3,497,410
Patented Feb. 24, 1970

3,497,410

METHOD OF DIE-STAMPING A PRINTED METAL CIRCUIT

John A. Zagusta, Forest Hills, N.Y., and Paul Anderson, Vernon, Conn., assignors to Rogers Corporation, Rogers, Conn., a corporation of Massachusetts Filed Feb. 5, 1965, Ser. No. 430,569
Int. Cl. B32b *31/20;* B44c *1/14*
U.S. Cl. 156—233 3 Claims

ABSTRACT OF THE DISCLOSURE

The disclosed method of making a printed circuit structure includes the step of prelaminating or adhesively bonding a conductive foil to an insulating sheet by the application of heat and pressure and then subjecting the assembly to a cold press operation prior to die-stamping the conductive pattern. This expedient serves to reduce shrinkage to a minimum whereby to maintain dimensional stability.

This invention relates to a printed circuit structure and method of making the same.

The invention has for an object to provide a novel and improved printed circuit structure which is characterized by improved fidelity of circuit pattern relative to the pattern of the die-stamping tool wherein the circuit pattern generated is smooth and undistorted.

The invention has for another object to provide a novel and improved method of making a printed circuit structure which is characterized by a novel and improved prelaminating and die-stamping technique whereby thin conductive foils may be utilized in producing a printed circuit structure.

A further object of the invention is to provide a novel and improved method of making printed circuit which is characterized by novel and improved steps including die-stamping the pattern utilizing an unheated stamping tool wherein shrinkage is reduced to a minimum and precise registry of pattern to tool is effected.

A still further object of the invention is to provide a novel and improved method of making a printed circuit structure including novel steps whereby precise circuit patterns are produced utilizing a hote die-stamping tool, shrinkage eliminated and registration of tool and foil increased.

With these general objects in view and such others as may hereinafter appear, the invention consists in the printed circuit structure and in the method of making a printed circuit as hereinafter described and particularly defined in the claims at the end of this specification.

In the drawings illustrating the preferred method of making a printed circuit:

Figure 1:
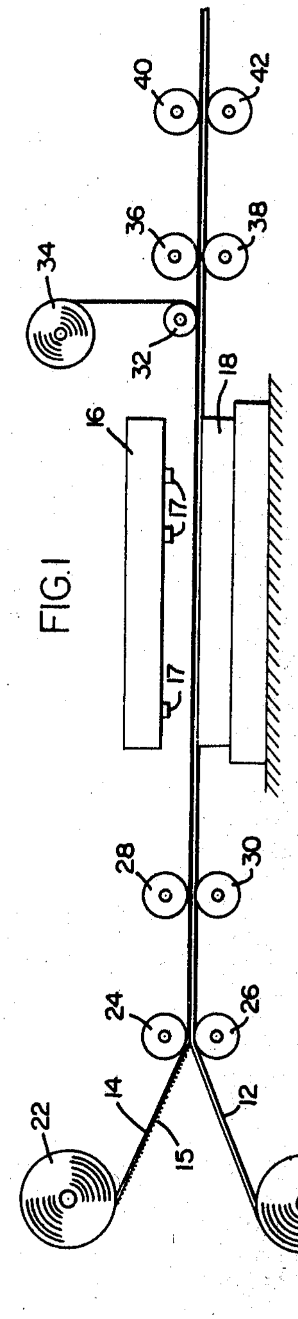
FIG. 1 is a side elevation illustrating more or less diagrammatically a form of apparatus which may be used in producing the present printed circuit.

In general, the present invention contemplates a novel and improved printed circuit structure or assembly and method of making the same wherein greatly improved fidelity of circuit pattern relative to the pattern forming tool is produced and wherein the pattern is smooth and undistorted.

In accordance with the present invention a thin sheet of metallic foil or other desired conductive material is prelaminated to a thin sheet of insulating material by means of a heat or pressure sensitive adhesive. The foil-insulation laminate is then die-stamped to cut the desired circuit pattern from the foil sheet. The unwanted foil is then removed from the surface of the insulating sheet material.

In accordance with the present invention highly efficient printed circuit assemblies or structures may be produced. The prebonding or prelaminating step enables very thin conductive metal foils to be used in producing the circuit pattern. The thin foil and insulating sheet laminate enables the foil to be cut and not torn as they would be if not prebonded to the thin insulating sheet. Another advantage resides in the fact that a cold die-stamping tool can be used in die-stamping the pattern from the foil sheet. The use of a cold stamping tool in generating the circuit pattern improves the fidelity of the pattern relative to the cutting tool. Precise registry of tool to pattern results from the elimination of insulation shrinkage. This is due in part to the use of the unheated tool and the prebonding step wherein the foil and insulation are securely affixed together, and the insulation does not become heat set or distorted during the die-stamping operation. In addition, insulation may be used in producing printed circuit structures which would be unusable utilizing prior methods. For example, polyvinyl chloride sheets may be used when the assembly is prelaminated and the pattern cut by a cold stamping tool. Use of a cold tool results in increased tool life and more stable tool dimensions.

The present novel method of producing highly efficient printed circuit structures also contemplates the use of heated die-stamping tools in combination with the prelaminated step. In certain instances it is desirable to use a heated tool to cut the circuit pattern, and the prelamination of the thin foil and insulating sheet provide improved tool pattern registration due to the fact that the prelamination substantially eliminates shrinkage of the insulation which normally occurs when the circuit pattern is cut with a heated tool.

In addition to the above advantages resulting from the present invention, the combination of prelamination and use of either heated or unheated die-stamping tools enables foils to be used which heretofore could not be cut to form the circuit patterns. For example, thin metal foils, such as stainless steel, Nichrome, "Tophet" A & C, manufactured by the Wilbur B. Driver Company, and beryllium copper may be used. Also, shallow tools may be used as the prelaminating step enabling metal foil sheet of from .00025 to .0005 inch in thickness and very thin plastic insulating films to be used, the cutting surfaces of the shallow tools being of sufficient depth to cut the desired pattern from the foil, but not the thin insulating substrate.

Referring now to the drawings, 10 represents a printed circuit assembly produced in accordance with the present invention wherein 12 comprises a relatively thin insulating sheet having a thin conductive metal foil circuit pattern 14 secured thereto. The thin insulating sheet may comprise various plastic materials, such as "Mylar," polyethylene, woven or non-woven fabric based on high strength synthetic fibers dipped or coated with a phenolic resin, thereby providing a relatively thin sheet having high dielectric properties. By way of example and not by way of limitation, the thickness of the insulating sheet may be from 0.002" to 0.010". However, in some instances thinner insulating sheets or films may be used. As illustrated in FIG. 1, a preferred form of apparatus for die-stamping and securing the conductive metal pattern 14 onto the insulating sheet 12 includes a pattern stamping punch or die indicated generally at 16 and which may be mounted on the movable member of a conventional punch press. In practice, the relatively thin insulating sheet having a metal foil sheet laminated thereto is placed on top of a resilient base member 18 which may be secured to a stationary portion of the punch press for cooperation with the stamping die.

As shown in FIG. 1, the insulating sheet 12 may be withdrawn from a supply roll 20 and intermittently advanced into operative relation to the stamping die. The metal foil 14 is provided on its underside with a coating of heat curable or pressure sensitive adhesive 15, such as phenolic butyral vinyl or natural rubber or neoprene, and the foil may be withdrawn from a supply roll 22. The thin metal foil is placed on top of the insulating sheet and is intermittently advanced therewith into operative relation to the stamping die. In operation, successive intermittently advanced lengths of the withdrawn material are die-stamped to produce a continuous length of printed circuit pattern assemblies or structures which are subsequently separated to produce individual printed circuits.

The insulating sheet 12 and the adhesive coated metal foil 14 withdrawn from their respective supply rolls are first combined by a laminating press or, as herein shown, by laminating pinch rolls including upper and lower heated rolls 24, 26 and upper and lower cold or unheated rolls 28, 30. The operation of passing the combined foil and insulating sheets between the heated rolls 24, 26 serves to partially cure or activate the adhesive coating to render it tacky and cause the foil to stick to the insulation. The subsequent passage of the laminated materials between the unheated rolls 28, 30 serves to partially set the adhesive sufficiently to hold the sheets together during their advance into operative relation to the stamping die.

Figure 2:
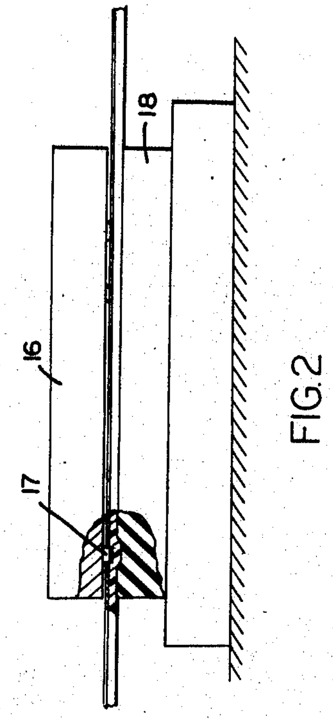
FIG. 2 is a side elevation partly in cross section of the stamping die in its lowered position.
Figure 3:
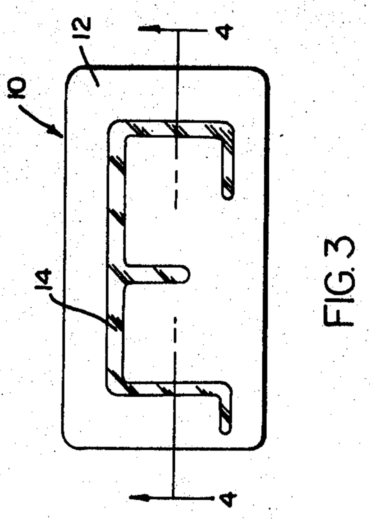
FIG. 3 is a plan view of a typical printed circuit produced by the present method.
Figure 4:
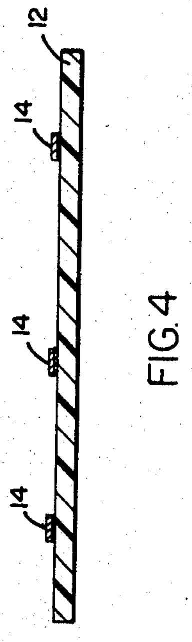
FIG. 4 is a cross sectional view taken on the line 4—4 of FIG. 3.

As above stated, in accordance with one embodiment of the present invention, the stamping die 16 is cold or unheated, and during the die-stamping operation the embossed or engraved portions 17 of the die engage the metal foil, and in cooperation with the material itself which serves as the female die the metal foil pattern is cut, the metal foil pattern adhering to the insulating sheet by virtue of the adhesive coating on the underside of the metal foil. As illustrated in FIG. 2, the resilient base member 18, which may be comprise rubber or like material, is capable of yielding during the stamping operation while providing sufficient support for the flexible insulating sheet to enable the metal foil to be cut without injury or damage to the insulating sheet.

In practice, after the conductive metal circuit pattern has been cut by the die-stamping tool, the stamping die is elevated, and upon intermittent advance of the material, the remainder or unwanted portion of the continuous metal foil sheet is stripped from the surface of the laminated sheet, the unwanted foil passing around an idler roll 32 where it is peeled from the surface of the insulation and then rolled onto a rewinding roll 34.

As further illustrated in FIG. 1, the continuous length of connected printed circuit assemblies may then be subjected to heat and pressure by passing the printed circuit asesemblies between upper and lower heated pinch rolls 36, 38 followed by passage of the assembly between upper and lower cold rolls 40, 42. The passage of the assemblies through the hot and cold presser roll sequence serves to improve the bond between the foil and the insulating sheet and also serves to flatten out any distortions in the sheet which may be caused by the stamping operation. The individual printed circuit assemblies may then be cut from the continuous length thereof and used as flexible printed circuit units, or they may be mounted on a rigid or semirigid insulating backing member.

While the invention has been herein described as a continuous operation wherein the elongated sheets of laminated foil and insulation are intermittently advanced to produce successive printed circuit assemblies in successive lengths of the laminate, it will be understood that the invention may be practiced by superimposing and laminating single sheets of conductive foil to single sheets of insulation and die-stamping the assembly with a cold die in the manner described.

From the foregoing description it will be apparent that the present printed circuit structure and method of making the same is characterized by providing printed circuit structures having high fidelity of pattern to die-stamping tool wherein insulation shrinkage is reduced to a minimum and wherein various materials may be used to produce the printed circuit assemblies in a highly efficient and economical manner utilizing either heated or unheated die-stamping tools for generating the circuit pattern.

Having thus described the invention, what is claimed is:

1. The method of making a printed circuit assembly, the steps comprising superimposing a thin conductive metal foil sheet having an adhesive coating on the underside thereof onto a plastic insulating sheet, laminating the assembly by the application of heat and pressure to render the adhesive tacky, subjecting the assembly to a cold pressing operation to partially set the adhesive, supporting the assembly on a base member, die-stamping the foil sheet to cut a circuit pattern from the foil sheet without the application of heat during the stamping operation, and then removing the surplus foil.

2. The method of making printed circuit assemblies comprising the steps of superimposing and adhesively securing an elongated sheet of thin conductive metal foil on an elongated sheet of insulating material embodying a curable resin, subjecting the assembly to heat and pressure to render the adhesive tacky, subjecting the assembly to a cold pressing operation to partially set the adhesive and resin and to provide a laminated structure, intermittently advancing successive lengths of the laminated structure onto a resilient base and into operative relation to a stamping die, cold die-stamping successive lengths of the structure to cut circuit patterns from the foil and to secure the pattern to the insulating sheet, removing the remaining foil from the insulating sheet as it is advanced, subjecting the laminated structure to a hot pressing operation to bond the foil to the insulation and to flatten the structure, and then subjecting the structure to a cold pressing operation.

3. The method of making a printed circuit assembly comprising the steps of superimposing and adhesively securing an elongated sheet of thin conductive metal foil on an elongated sheet of insulating material, one of said sheets having an adhesive on the surface thereof facing the other of said sheets, laminating the assembly by the application of heat and pressure to render the adhesive tacky, subjecting the assembly to a cold pressing operation to partially set the adhesive, supporting the assembly on a base member, die-stamping the foil sheet to cut a circuit pattern from the foil sheet without the application of heat during the stamping operation, removing surplus foil, and subjecting the remaining assembly to a hot pressing operation to bond the foil comprising the circuit pattern to the insulating sheet.

References Cited

UNITED STATES PATENTS

| | | | |
|---|---|---|---|
| 3,086,904 | 4/1963 | Uhleen | 156—320 |
| 3,301,730 | 1/1967 | Spiwak et al. | 156—267 |
| 2,969,300 | 1/1961 | Franz | 156—233 |

JACOB H. STEINBERG, Primary Examiner

U.S. Cl. X.R.

156—169, 267, 498